United States Patent [19]
Lebeau et al.

[11] Patent Number: 5,563,703
[45] Date of Patent: Oct. 8, 1996

[54] LEAD COPLANARITY INSPECTION APPARATUS AND METHOD THEREOF

[75] Inventors: Christopher J. Lebeau, Tempe; James E. Hopkins, Mesa, both of Ariz.

[73] Assignee: Motorola, Inc., Schaumburg, Ill.

[21] Appl. No.: 541,346

[22] Filed: Oct. 10, 1995

Related U.S. Application Data

[63] Continuation of Ser. No. 262,175, Jun. 20, 1994, abandoned.

[51] Int. Cl.⁶ ................................................. G01B 11/24
[52] U.S. Cl. ........................ 356/237; 382/146; 348/126
[58] Field of Search .................................. 356/237, 394, 356/375, 376; 250/560, 561; 382/8, 145, 146, 147, 149; 29/720, 721, 729, 740, 759; 348/87, 126

[56] References Cited

U.S. PATENT DOCUMENTS

| | | | |
|---|---|---|---|
| 4,696,047 | 9/1987 | Christian et al. | 382/8 |
| 4,793,707 | 12/1988 | Hata et al. | 356/375 |
| 4,875,778 | 10/1989 | Luebbe et al. | 356/394 |
| 5,043,589 | 8/1991 | Smedt et al. | 250/561 |
| 5,061,895 | 10/1991 | Fong | 324/158 R |
| 5,131,753 | 7/1992 | Pine et al. | 356/375 |
| 5,140,643 | 8/1992 | Izumi et al. | 356/237 |
| 5,249,239 | 9/1993 | Kida | 348/126 |
| 5,309,223 | 5/1994 | Konicek et al. | 356/375 |
| 5,452,080 | 9/1995 | Tomiya | 356/237 |

FOREIGN PATENT DOCUMENTS 6042932  2/1994  Japan .................. 356/376

*Primary Examiner*—Hoa Q. Pham
*Attorney, Agent, or Firm*—Aaron B. Bernstein; George C. Chen

[57] ABSTRACT

An apparatus for and method of determining the coplanarity of leads of a semiconductor device is provided. The apparatus comprises a base (24) for placing the semiconductor device, and a plurality of mirrors (38) and (36) surrounding the base. The mirrors reflect an image of the leads of the semiconductor device to a camera. The camera records an image from which the lead coplanarity is determined. The base contains an optical datum (34) which provides a reference plane from which to measure coplanarity. The mirrors can be placed such that an off-axis image of the leads is reflected to the camera. The off-axis image improves the apparent sensitivity of the coplanarity measurement.

24 Claims, 3 Drawing Sheets

5,563,703

LEAD COPLANARITY INSPECTION APPARATUS AND METHOD THEREOF

This application is a continuation of prior application Ser. No. 08/262,175, filed Jun. 20, 1994, abandoned.

FIELD OF THE INVENTION

The present invention relates, in general, to semiconductor device inspection, and more particularly to semiconductor device lead inspection.

BACKGROUND OF THE INVENTION

During the production of semiconductor devices it is necessary that certain critical parameters are met. For example, semiconductor device leads must meet parameters on tip-offset, lead skew, and lead coplanarity. To ensure that a semiconductor device has met these parameters they must be inspected after production. This type of inspection often is done manually by assembly line workers. This type of inspection is labor intensive and thus very expensive.

Prior art automated inspection methods use cameras and computer systems to measure lead parameters. A semiconductor device is placed on a testing pedestal, and a digital image of its leads are taken. The computer system uses the image to determine lead parameters. These methods, while much faster than manual methods, require expensive high resolution cameras and expensive corrective optics.

Conventional automated systems are also difficult to calibrate. To calibrate these systems a high tolerance optical calibration gauge is used. The gauge is placed on a test pedestal, and its position is recorded by the computer. This recorded position is used as the reference plane for determining lead parameters such as coplanarity. Unfortunately, the high tolerance gauges required are expensive. Also, if the relative position of the camera and semiconductor device change the recorded lead position will no longer be accurate. Thus extreme care must be taken to insure the camera and semiconductor device pedestal have a fixed relative position. This often requires large and complicated devices that require significant space.

Consequently it is desirable to have a method for measuring lead coplanarity that does not require the use of high resolution cameras and does not require the use of a precise optical calibration gauge for reference plane definition.

DETAILED DESCRIPTION OF THE DRAWINGS

According to one embodiment of the present invention an improved automated semiconductor lead inspection system is provided. A semiconductor device is placed upon a lead inspection apparatus, and an image is recorded, and a computer system determines lead parameters from that image.

The lead inspection apparatus of one embodiment has an integral optical datum that appears in each image taken of the semiconductor device. The integral optical datum provides a constant reference to measure lead coplanarity. The use of the optical datum precludes the need for expensive calibration gauges and does not require precise alignment of the camera and the semiconductor device.

In one embodiment according to the present invention, the lead inspection apparatus comprises a base for receiving the semiconductor device, and four mirrors surrounding and facing the base and semiconductor device. The base of the apparatus has an optical datum beneath the topside of the base. The four mirrors reflect an image of the semiconductor device leads and the optical datum to the camera that can be used by the computer to determine lead coplanarity. The optical datum provides a fixed reference frame for measuring the coplanarity of the leads.

According to another embodiment of the present invention the four mirrors surrounding the base are at an angle that reflects an off-axis image of the semiconductor device leads to the camera. This off-axis image of the semiconductor device leads provides a more sensitive image from which to compute the semiconductor device lead coplanarity.

In another embodiment both an optical datum and an off-axis image of the semiconductor device leads are used. The off-axis image provides a more sensitive image of the semiconductor device leads, and the optical datum provides a constant reference plane to determine coplanarity.

Figure 1:
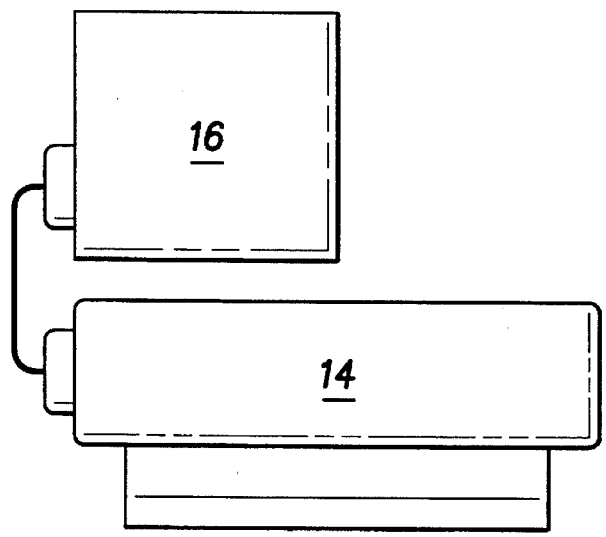
FIG. 1 is a schematic side view representing an apparatus for semiconductor device lead inspection.
Figure 1:
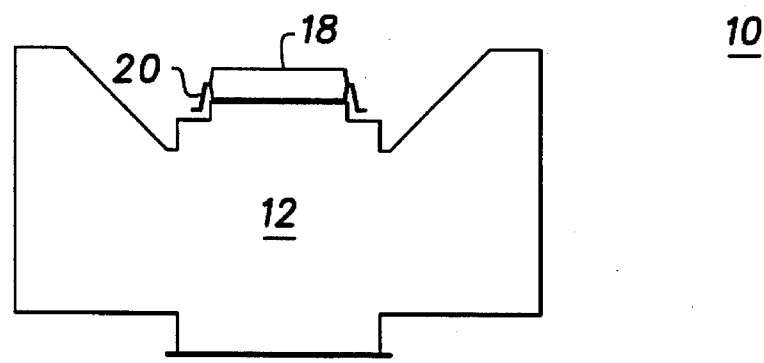

Turning now to the figures for a more detailed description of the preferred embodiments, FIG. 1 is a schematic side view representing a semiconductor device lead inspection apparatus. FIG. 1 shows a semiconductor device lead inspection system 10. The system includes a lead inspection apparatus 12, a camera 14 and a computer system 16. A semiconductor device 18 is placed on the lead inspection apparatus 12. The camera 14 can be any type of image capturing device such as a charge coupled device (CCD). The camera 14 captures an image of the semiconductor device 18. The captured image is then processed by computer system 16. Using the processed image the computer system 16 determines the coplanarity, tip-offset and lead skew of the semiconductor device leads 20.

Figure 2:
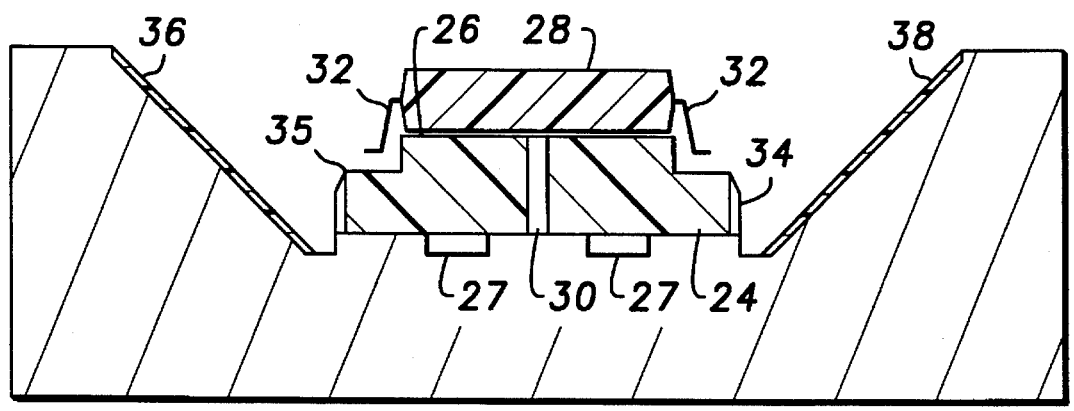
FIG. 2 is a cross-sectional side view representing an apparatus for semiconductor device lead inspection.

Turning now to FIG. 2, FIG. 2 is a cross-sectional side view representing a semiconductor device lead inspection apparatus 22. The inspection apparatus 22 includes a base 24 having a top side 26 for holding a semiconductor device 28. The semiconductor device 28 is held in place by a vacuum which is supplied through shaft 30.

The inspection apparatus 22 also comprises illuminating light sources 27. The inspection apparatus base 24 is made with a translucent material such as white nylon. The translucent material allows a light source 27 to illuminate the semiconductor device leads 32 from beneath the semiconductor device 28. This provides a camera (not shown in this figure) with a high contrast image of the semiconductor device leads 32. The high contrast image reduces errors in semiconductor lead measurements.

The inspection apparatus base 24 has an optical datum ring 34 beneath the top side 26 of the base 24. This optical datum ring 34 is machined to provide a precise reference plane to from which to measure lead coplanarity. This plane is defined by the top edge 35 which circumscribes optical datum ring 34. The key characteristic of the optical datum ring 34 is that edge 35 is precisely flat all the way around the ring 34. The flatter the edge 35 optical datum ring 34 the more accurate the reference plane it provides.

In one embodiment the optical datum 34 is sloped to a point at its top surface (edge 35). The slope and thin top surface minimizes the accumulation of foreign materials on the top surface of the optical datum ring 34. This maintains the precision of the reference plane provided by the optical datum ring 34.

Mirrors 36 and 38 in combination with two corresponding side mirrors (not shown in this figure) are placed surrounding and facing semiconductor device 28 and optical datum ring 34. An image of the semiconductor device leads 32 and the optical datum ring 34 is reflected towards a camera (not shown in this figure) by the mirrors. The image reflected by the mirrors is of all four sides of the semiconductor device 28 and all four sets of semiconductor leads 32. Because the optical datum is a ring around the entire base 24 it provides a reference plane to measure the coplanarity of all four sets of semiconductor device leads 32.

Figure 3:
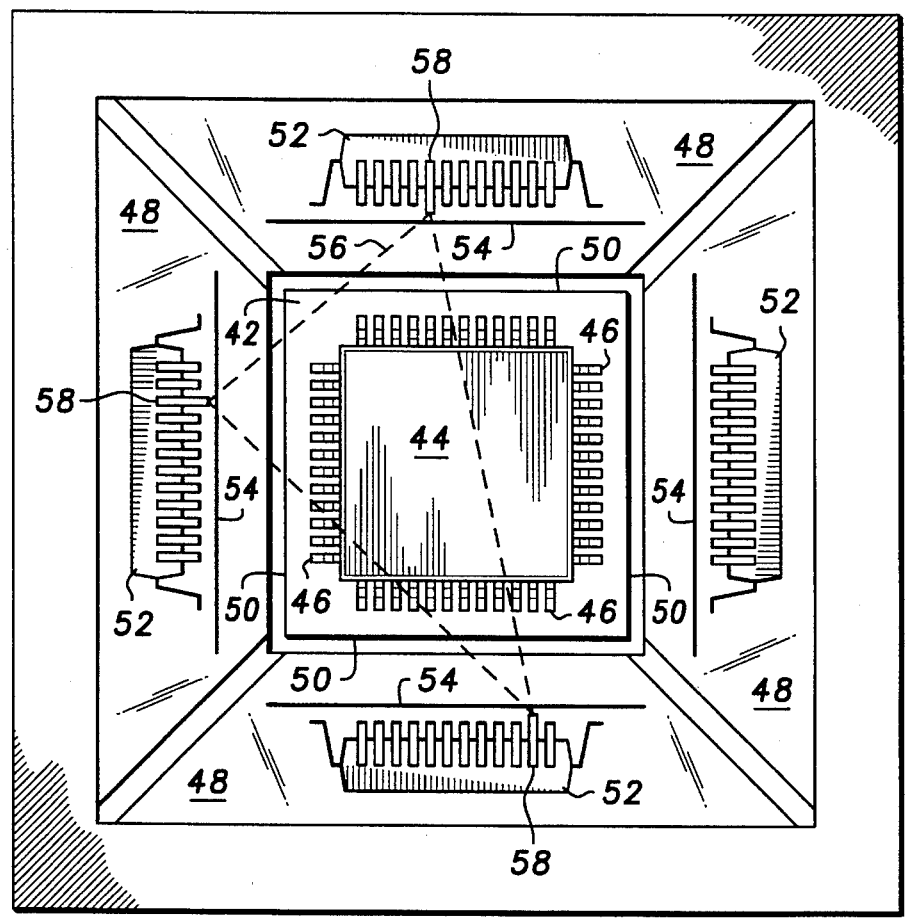
FIG. 3 is a top view representing a semiconductor device lead inspection apparatus.

Turning now to FIG. 3. FIG. 3 is top view representing a semiconductor device lead inspection apparatus 40. The lead inspection apparatus 40 has a base 42 for receiving the semiconductor device 44. The semiconductor device 44 has four sets of leads 46. An optical datum 50 surrounds the base 42 beneath the semiconductor device 44. Four mirrors 48 surround and face towards the semiconductor device 44. The four mirrors 48 reflect a four-sided image 52 of the semiconductor device leads 46 and a four sided image 54 of the optical datum 50. Therefore a camera positioned above the lead inspection apparatus 40 captures an image of all four sets of leads of semiconductor device 44 as well as a topside view of semiconductor device 44. Using a single image the coplanarity, tip-offset and lead skew of semiconductor device 44 can be determined.

To determine coplanarity a computer (not shown in this figure) first measures the distance from the reflected image of the optical datum 54 to the reflected image of the semiconductor device leads 52. Because the optical datum 50 is machined with extreme precision a precise reference plane is provided for measuring the coplanarity of all the leads of semiconductor device 44. Also, because the reflected image of the optical datum 50 appears in all images captured by the camera there is no need for expensive and difficult calibration through the use of gauges and other methods. In addition, because the reference plane provided by the optical datum 50 is independent of the position of the camera, movement of the camera will not effect it. Therefore a system can be set up for measuring coplanarity and future vibrations and other movement of the camera will not effect the accuracy of the coplanarity measurements. From the top view of the semiconductor device 44 the x and y positions of the leads 46 are obtained. It will be understood that the coplanarity component is the z position.

After measuring the z position which is the distance between the reflected image of the leads 52 and the reflected image of the optical datum 54, and the x, y position of the leads, the computer determines a seating plane 56. Seating plane 56 is defined as the plane determined by the position of three lowest leads 58 of the semiconductor device 44 which contain the center of gravity of the semiconductor device 44. Three lowest leads 58 contain the center of gravity if drawing lines between them would enclose the center of gravity of the semiconductor device.

Referring briefly to FIG. 2, even if the semiconductor device is not placed flush with the top side 26 of the base 24, the seating plane and hence the coplanarity can still be accurately determined as long as the optical datum 54 has a flat top surface. This is because, given a flat optical datum, an x, y, z position can be identified for each lead. The computer can then iteratively define planes with three leads which contain the center of gravity of the device, and check whether there are any other leads lying below that plane. If so, those new lower leads are used to define a new plane, and so on. Eventually, the seating plane is found. Consequently, the seating plane is only a function of the relative position of the leads and not the alignment of the semiconductor device.

The coplanarity of a semiconductor device lead is defined as the distance from that lead to the seating plane. The coplanarity is computed by the computer in this manner to determine whether the semiconductor device has the required coplanarity.

Figure 4:
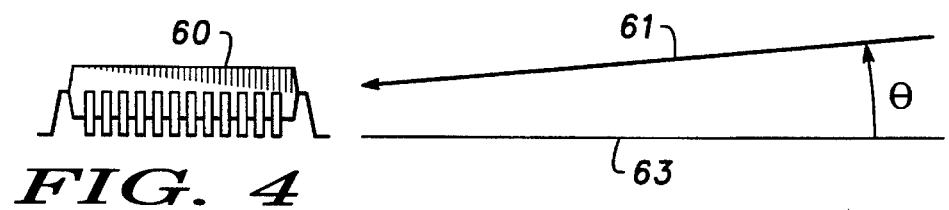
FIG. 4 is a side view illustrating an inspection method.

Turning now to FIG. 4, FIG. 4 is a side view illustrating an inspection method. In another embodiment in accordance with the present invention, an off-axis view of a semiconductor device is provided to enhance the sensitivity of the lead coplanarity measurement. The off-axis angle φ is the angle formed from the intersection of a line of sight of the leads indicated by arrow 61 and the plane 63 defined by the bottom side of the semiconductor device 60. In a preferred embodiment the angle φ is 5 degrees but can range from about 3 degrees to 22 degrees.

Figure 5:
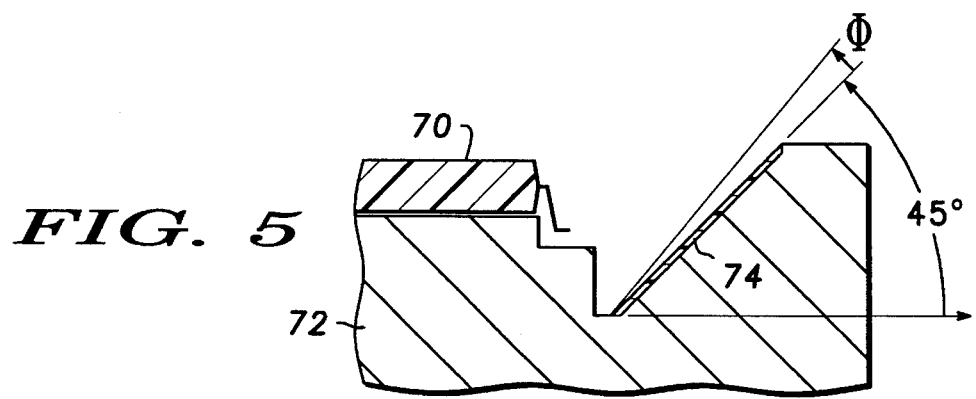
FIG. 5 is a side view representing an inspection apparatus.

Turning to FIG. 5, FIG. 5 is a cross-sectional side view representing an apparatus for obtaining an off-axis view of a semiconductor device. A semiconductor device 70 is placed on a base 72. A mirror 74 is set facing the base 72 and the semiconductor device 70. The mirror reflects an image of the semiconductor device 70 towards a camera (not shown in this figure). A mirror at a 45 degree angle as shown would reflect an on-axis side view of the semiconductor device 70. Moving the mirror 74 up an angle φ provides an off-axis image of the semiconductor device 70 at angle φ. The angle φ corresponds directly to the off-axis angle φ of FIG. 4.

Figure 6:
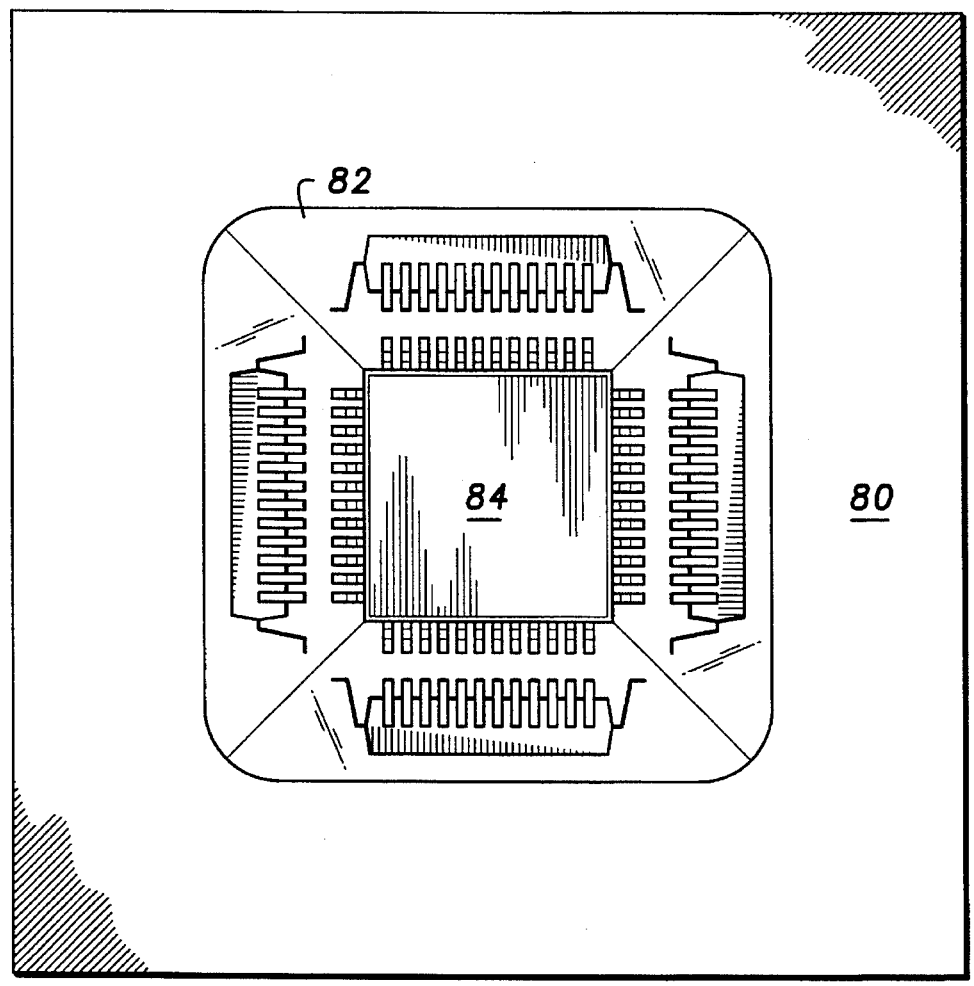
FIG. 6 is a top view representing an inspection apparatus.

Turning now to FIG. 6, FIG. 6 is a top view representing a semiconductor device lead inspection apparatus. An inspection apparatus 80 is provided with four mirrors 82 surrounding a base 84. The four mirrors 82 reflect an off-axis image of a semiconductor device 84 towards a camera (not shown in this figure). Because a top view of the semiconductor device 84 is also shown in the same image, the camera records coplanarity, lead skew and tip-offset in one image. An optical datum may also be provided in this embodiment in addition to the off-axis angle. Such a configuration will provide a precise reference plane in the optical datum and off-axis view of the semiconductor device 84. For example, an off-axis image of an optical datum and an off-axis image of the leads of semiconductor device 84 can be used to define a seating plane, which is calculated in a manner similar to seating plane 56 of FIG. 3. The coplanarity of a particular lead of semiconductor device 84 is then defined as the distance from the particular lead of semiconductor device 84 to the calculated seating plane.

Figure 7:
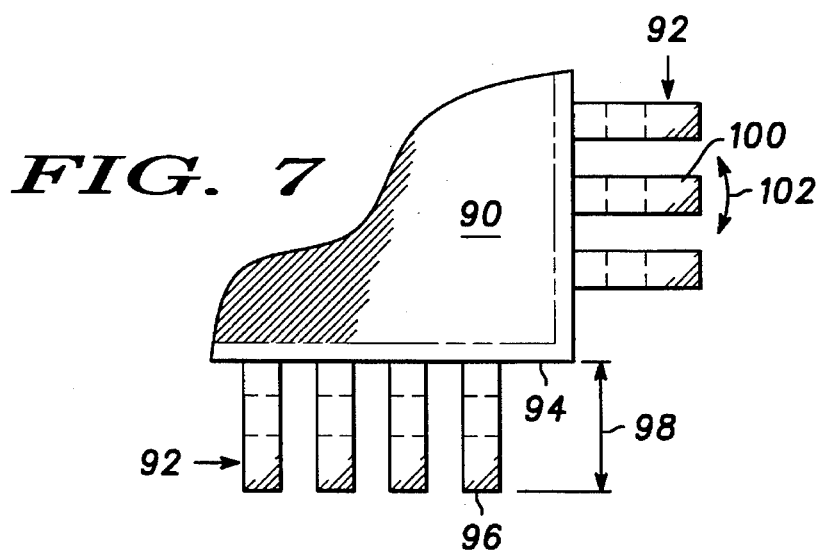
FIG. 7 is a top view representing a semiconductor device.

Turning now to FIG. 7, FIG. 7 is a top view representing a semiconductor device 90 that has leads 92. FIG. 7 is provided to illustrate tip-offset and lead skew. The tip-offset of a lead 96 is defined as a distance from the side of a semiconductor device 94 to the tip of the lead 96. The tip-offset distance is represented by line 98. The lead skew of lead 100 is the amount of side to side movement of the lead 100. The lead skew is shown by line 102.

While the invention has been particularly shown and described with reference to the preferred embodiments thereof, it will be understood by those skilled in the art that the foregoing and other changes in form and details may be made therein without departing from the spirit and scope of the invention.

We claim:

1. An apparatus for determining a coplanarity of electrical leads of a semiconductor device comprising:

an image capturing device;

a base including a top side; and at least one mirror facing the base at an angle such that an off-axis image of the electrical leads is reflected to the image capturing device, positions of three lowest electrical leads in the off-axis image defining a seating plane, and the coplanarity of an electrical lead defined as a distance from the electrical lead to the seating plane.

2. An apparatus as in claim 1 wherein the at least one mirror comprises four mirrors.

3. An apparatus as in claim 1 wherein the base comprises white nylon material and a light source beneath the top side of the base, the light source illuminating the semiconductor device through the white nylon material.

4. An apparatus as in claim 1 wherein the off-axis angle comprises an angle between 3 degrees and 22 degrees.

5. An apparatus for determining a coplanarity of electrical leads of a semiconductor device comprising:

a camera;

a base including a top side and an optical datum; and at least one mirror facing the base at an angle that reflects an off-axis image of the semiconductor device and the optical datum to the camera, distances between the electrical leads of the semiconductor device in the off-axis image and the optical datum in the off-axis image defining positions of the electrical leads, positions of three lowest electrical leads defining a seating plane, and the coplanarity of an electrical lead defined as a distance from the electrical lead to the seating plane.

6. An apparatus as in claim 5 wherein the at least one mirror comprises four mirrors.

7. An apparatus as in claim 5 wherein the base comprises white nylon material and a light source beneath the top side of the base, the light source illuminating the semiconductor device through the white nylon material.

8. An apparatus as in claim 5 wherein the off-axis angle comprises an angle between 3 degrees and 22 degrees.

9. An apparatus for determining a coplanarity of electrical leads of a semiconductor device comprising:

an image capturing device;

a base including a top side and an optical datum; and at least one mirror facing the base at an angle that reflects an image of the electrical leads and the optical datum towards the image capturing device, distances between the electrical leads in the image and the optical datum in the image defining positions of the electrical leads, positions of three lowest electrical leads defining a seating plane, and the coplanarity of an electrical lead defined as a distance from the electrical lead to the seating plane.

10. An apparatus as in claim 9 wherein the at least one mirror comprises four mirrors.

11. An apparatus as in claim 10 wherein the image capturing device captures an image of a top side of the semiconductor device and further comprising a computer system determining the coplanarity of the leads based upon a distance of a reflected image of the optical datum relative to the reflected image of the semiconductor device leads and for determining the lead skew and tip-offset from the image of the top side of the semiconductor device.

12. An apparatus as in claim 9 wherein the base comprises white nylon material and a light source beneath the top side of the base, the light source illuminating the semiconductor device through the white nylon material.

13. An apparatus as in claim 9 wherein the optical datum comprises a ring around the base and below the top side of the base.

14. An apparatus as in claim 9 wherein the optical datum comprises a ring having a top portion sloped to a point, the optical datum positioned around the base and below the top side of the base.

15. An apparatus as in claim 9 further comprising a computer system determining the coplanarity of the leads based upon the distance of the reflected image of the optical datum relative to the reflected image of the semiconductor device leads.

16. An apparatus for determining coplanarity of electrical leads of a semiconductor device comprising:

a camera;

a base having a top side receiving the semiconductor device, an optical datum, and an interior light source for illuminating the top side of the base;

four mirrors facing the base at an angle that reflects an image of the semiconductor device leads and an image of the optical datum to the camera; and a computer system determining a seating plane defined by positions of three lowest electrical leads, distances between the image of the semiconductor device leads and the image of the optical datum defining positions of the electrical leads, and computing the coplanarity of an electrical lead, the coplanarity defined by a distance from the electrical lead to the seating plane.

17. The apparatus as in claim 16 wherein the optical datum comprises a rings having a top portion sloped to a point, the optical datum positioned around the base and below the top side of the base.

18. The apparatus as in claim 16 wherein the reflected image of the semi-conductor device leads is an off-axis image.

19. A method for determining coplanarity of electrical leads comprising the steps of:

capturing an off-axis image of the electrical leads; and computing lead coplanarity by determining positions of three lowest electrical leads from the off-axis image of the electrical leads to define a seating plane, the coplanarity of an electrical lead defined as a distance from the electrical lead to the seating plane.

20. A method as in claim 19 wherein the image captured is a reflected image of the electrical leads.

21. A method as in claim 20 wherein the image captured further comprises a top side view of the semiconductor device and further comprising the step of computing the tip-offset and lead skew.

22. A method for determining coplanarity of electrical leads comprising the steps of:

providing an optical datum;

capturing an image of the electrical leads and the optical datum; and computing lead coplanarity by determining positions of three lowest electrical leads to define a seating plane, distances between the electrical leads in the image and the optical datum in the image defining positions of the electrical leads, the coplanarity of an electrical lead defined as a distance from the electrical lead to the seating plane.

23. The method as in claim 22 wherein the image captured is a reflected image of the electrical leads and the optical datum.

24. A method as in claim 23 wherein the image captured further comprises an top side view of the semiconductor device and further comprising the step of computing the tip-offset and lead skew.

* * * * *